United States Patent
Andújar et al.

(10) Patent No.: US 6,720,035 B2
(45) Date of Patent: Apr. 13, 2004

(54) METHOD FOR COATING CERAMIC DISCS AND CERAMIC DISC OBTAINED BY SAID METHOD

(75) Inventors: Josè-Luis Andújar, Barcelona (ES); Joan Esteve Pujol, St. Cugat (ES); Xavier Ferret Picazo, El Papiol (ES); Maria Benelmekki, Mollet (ES)

(73) Assignee: Industrias Ramon Soler, S.A., Sant Joan Despi (ES)

( * ) Notice: Subject to any disclaimer, the term of this patent is extended or adjusted under 35 U.S.C. 154(b) by 0 days.

(21) Appl. No.: 10/195,272

(22) Filed: Jul. 15, 2002

(65) Prior Publication Data

US 2003/0017339 A1 Jan. 23, 2003

(30) Foreign Application Priority Data

Jul. 17, 2001 (ES) ............................................ 200101669

(51) Int. Cl.$^7$ .............................................. C23C 14/02
(52) U.S. Cl. ...................... 427/534; 427/577; 427/249.7
(58) Field of Search ................................ 427/533, 534, 427/577, 249.7

(56) References Cited

U.S. PATENT DOCUMENTS

| | | | | |
|---|---|---|---|---|
| 5,104,709 A | * | 4/1992 | Kokaku et al. | 428/65.4 |
| 5,159,508 A | * | 10/1992 | Grill et al. | 360/235.2 |
| 5,202,803 A | * | 4/1993 | Albrecht et al. | 360/97.02 |
| 5,858,477 A | * | 1/1999 | Veerasamy et al. | 427/562 |
| 5,949,612 A | * | 9/1999 | Gudeman et al. | 360/97.01 |

* cited by examiner

Primary Examiner—Bret Chen
(74) Attorney, Agent, or Firm—Steinberg & Raskin, P.C.

(57) ABSTRACT

The method includes the phases of preparation of said ceramic discs once lapped and polished; and deposition of a layer of hydrogenated amorphous carbon (or DLC: Diamond-Like Carbon) on said ceramic discs, said deposition phase including the following stages: exposure of said ceramic discs to vacuum; application of a cleaning plasma on said ceramic discs; application of a first deposition plasma on said ceramic discs; and application of a second deposition plasma on said ceramic discs. The ceramic disc is characterized in that it includes a layer of hydrogenated amorphous carbon deposited directly onto the ceramic disc. Thereby are obtained ceramic discs for utilization in mixer valves of single-lever mixer type whose friction coefficient is lower that that of the ceramic discs currently used, all this without loss of leak tightness, without having to use grease and with a low manufacturing cost.

8 Claims, 2 Drawing Sheets

METHOD FOR COATING CERAMIC DISCS AND CERAMIC DISC OBTAINED BY SAID METHOD

This invention relates to a method for coating ceramic discs, using said discs in fluids mixer valves of the single-lever mixer type.

This invention also relates to a ceramic disc obtained by said method and which thus permits a reduction of the friction coefficient between the coated ceramic discs.

BACKGROUND OF THE INVENTION

Mixer valves of the single-lever type include a pair of ceramic discs mounted one on top of the other. The rotation of the upper disc on the lower disc, which is fixed, determines the mixture of cold and hot water, permitting in its end positions the output of only cold water or only hot water. The diametral sliding of the upper disc on the lower disc determines the opening and closing of the valve, permitting the output flow of water to be adjusted.

One problem these ceramic discs have is that a low friction coefficient must be combined with excellent leak tightness. For this reason, it is usual to use grease to reduce the friction coefficient, though no kind of coating adhering to the discs is used.

An attempt has been made to solve these disadvantages by using hydrogenated amorphous carbon, usually known as DLC (Diamond-Like Carbon) to reduce the friction coefficient. This compound, also defined as amorphous diamond, is a combination of various carbon structures (graphite, diamond, amorphous carbon, etc.).

WO/860458 discloses a method for manufacturing members for seals, such as ceramic discs, for controlling the flow of fluids in a valve. Said seals are made of ceramics, metal or synthetic materials. These seals are coated with a fine layer of a hard material such as silicon carbide, metal carbide, metal nitrides or cubic crystalline carbon. The coating can be implemented by chemical vapour deposition (CVD). This method permits functioning of the valves without need for lubricant.

U.S. Pat. No. 5,927,727 discloses seal members, especially for sealing and regulating devices, together with a method for manufacturing them. Said members can be made of metallic or non-metallic materials, such as a ceramic material like $Al_2O_3$ SiC, $Si_2C$ or $Si_3N_4$.

These valves include a coating of multiple layers, a coat of silicon with low carbon content in order to improve adherence and increase hardness, and a second coat of carbon with silicon in order to reduce the friction coefficient. Once the valve with the coating has been obtained it is submitted to a curing process for 30 to 60 minutes at 500° C., or of 30 seconds to 1 minute at 900° C. The deposition is carried out by chemical vapour deposition or polymerisation by plasma.

U.S. Pat. No. 5,100,565 discloses a valve made up of a fixed disc and a sliding ceramic disc. These discs present a coating of DLC deposited by means of chemical vapour deposition by plasma. The objective of these valves is to ensure that the discs function correctly with coating and without grease. In order to improve adherence of the coating, multiple layers of TiN, TiC and DLC are deposited.

EP-0 884 509 discloses the use of ceramic discs for valves coated with DLC with an intermediate layer of titanium and silicon in order to achieve correct functioning and longer valve life. The deposition method is chemical vapour deposition by plasma, in which the reactive gases are $TiCl_4$, $SiCl_4$ and $C_6H_6$.

Although all the documents cited relate to coating of valves and ceramic or metal seals in order to achieve hardness and a low friction coefficient without need for lubricants, it is always necessary to deposit at least one intermediate layer, in order to improve adherence and achieve greater hardness. That is, none of the documents cited describe the deposition of DLC directly onto the ceramic members.

Another disadvantage of the methods disclosed in the documents cited is that the deposition process is carried out at high temperatures, mainly between 700° C. and 900° C., and in the case of depositions at high temperature curing is needed after the deposition, and this entails a high manufacturing cost.

DESCRIPTION OF THE INVENTION

The method and the disc of this invention manage to resolve the aforesaid disadvantages, while presenting other advantages which will be described below.

The method of this invention for the coating of previously lapped and polished ceramic discs is characterized in that it includes the phases of:

preparation of said ceramic discs; and deposition of a layer of hydrogenated amorphous carbon on said ceramic discs;

with said deposition phase including the following stages:

exposure of said ceramic discs to a vacuum;

application of a cleaning plasma on said ceramic discs;

application of a first deposition plasma on said ceramic discs; and application of a second deposition plasma on said ceramic discs.

Advantageously, said deposition is carried out by chemical vapour deposition assisted by radio frequency plasma at room temperature.

According to a preferred embodiment, said cleaning plasma is applied by means of argon, at a pressure between 8 and 12 Pa, with an auto polarization power of between −1000 and −600 V and for a period of time of between 4 and 10 minutes.

Preferably, said first deposition plasma is applied by means of methane, at a pressure between 8 and 12 Pa, with an auto polarization power of between −400 and −1000 V, with a radio frequency power between 250 and 275 W, and for a period of time of between 2 and 5 minutes.

According to said preferred embodiment, the second deposition plasma is applied by means of methane, at a pressure between 8 and 12 Pa, with an auto polarization power of between −300 and −700 V, with a radio frequency power between 40 and 60 W, and for a period of time of between 5 and 9 minutes.

Said phase of preparation of the ceramic discs includes, preferably, the following phases:

cleaning of the ceramic discs;

drying of said ceramic discs; and evaporation of substances impregnated in said ceramic discs.

Said cleaning of the ceramic discs can be carried out by means of acetone and ethanol baths in an ultrasound washer for a period of time between 15 and 25 minutes.

According to a second embodiment, the invention also relates to a ceramic disc which is applicable to fluid mixer valves, characterized in that it includes a layer of hydrogenated amorphous carbon deposited directly onto the ceramic disc.

Said layer of hydrogenated amorphous carbon has a thickness of between 275 and 325 nm and a hardness of between 10 and 18 GPa.

The coating method of this invention achieves ceramic discs for utilization in mixer valves of the single-lever type whose friction coefficient is lower than that of the ceramic discs currently used, all this without loss of leak tightness, without having to use greases or intermediate layers and with a reduced manufacturing cost, thanks to the speed of the process and the carrying out of the deposition at room temperature.

BRIEF DESCRIPTION OF THE DRAWINGS

In order to demonstrate the better functioning of the discs coated according to the method of this invention a number of tests were carried out, the results of which are shown in the attached charts, in which.

DESCRIPTION OF A PREFERRED EMBODIMENT

Figure 1:
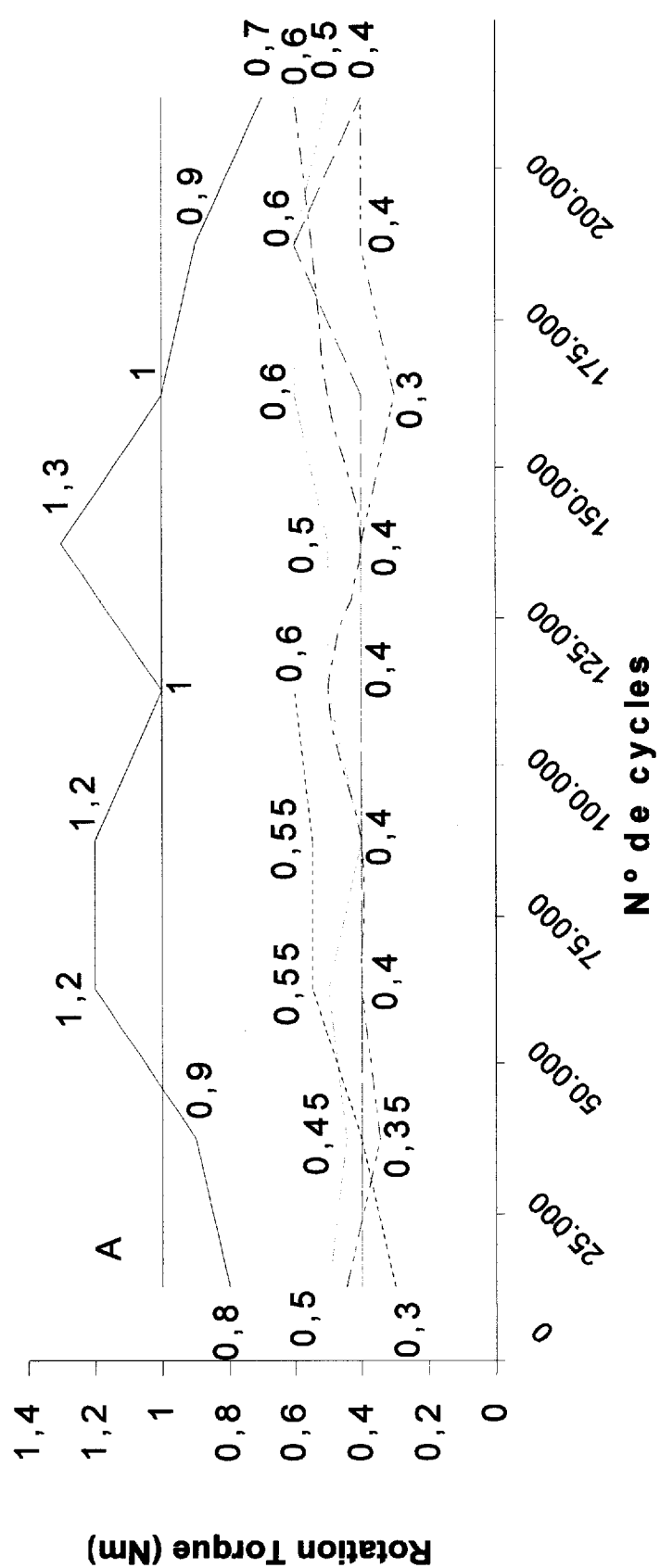
FIG. 1 is a chart showing the results obtained upon measuring the rotation torque of the valve cartridge in function of the number of cycles, with the valve open.

When the presenter of this application considered the possibility of coating the ceramic discs of the single-lever valve type with hydrogenated amorphous carbon, known as DLC (Diamond-Like Carbon), difficulty was found in ensuring that the layer of DLC had sufficiently acceptable adherence qualities for said discs to comply with current regulations.

Due to this, various preliminary tests were carried out in order to determine the parameters and phases of the coating method for said discs.

Firstly, nucleation of DLC was implemented on lapped but non-polished discs, and it was found that the layer of DLC had good adherence and a speed of growth of the layer of 50 nm/minute, which was an excellent value. Upon carrying out the leak tightness tests, however, it was found that the results were unacceptable, as water pressure was gradually lost. The results obtained in the tests carried out led to the possibility of using lapped but non-polished ceramic discs being ruled out.

The foregoing option having been ruled out, nucleation of DLC onto lapped and polished ceramic discs was carried out, thereby achieving the coating method of this invention.

Firstly, the previous lapped and polished ceramic discs were submitted to a cleaning process by means of acetone and ethanol baths in an ultrasound washer for 20 minutes.

Once clean, the discs were dried and, when the desired temperature was reached, evaporation of the substances impregnated in said ceramic discs took place.

The phase of deposition of the DLC on the ceramic material was carried out by radio frequency plasma chemical vapour deposition (PECVD). In order to achieve nucleation of the DLC on the discs at room temperature and using methane or acetylene as precursor gas, a prior vacuum was created at a pressure of $10^{-1}$, followed by application of a cleaning plasma, consisting in ionic bombardment with argon on the surface of the piece for 5 minutes at an auto polarization power of −800 and a pressure of 10 Pa.

With this nucleation a speed of growth of the DLC layer of 8 nm/min. was achieved, as were good adherence and leak tightness. This speed of growth was nevertheless considered to be too low for industrial production at reasonable cost.

In consequence, said nucleation was optimised with the objective of increasing the speed of growth. For this purpose, a first deposition plasma with methane was applied for three minutes, with an auto polarization power of −900 V, a radio frequency power of 160 W and a pressure of 10 Pa.

A second deposition plasma with methane was then applied for 10 minutes, with an auto polarization power of −500 V, a radio frequency power of 50 W and a pressure of 10 Pa.

The application of this process of optimization achieved a speed of growth of 30 nm/min., which is an excellent value for an industrialization process.

The method of this invention provides a ceramic disc which includes a layer of DLC deposited directly onto it with a thickness of approximately 300 nm and an approximate hardness of 14 GPa.

In order to demonstrate the excellent functioning of the ceramic discs for valves provided with a coating of DLC made according to the method of this invention, charts are attached showing the results of some tests.

In these tests a triangular movement was implemented in accordance with standard UNE EN 817/1997.

Figure 2:
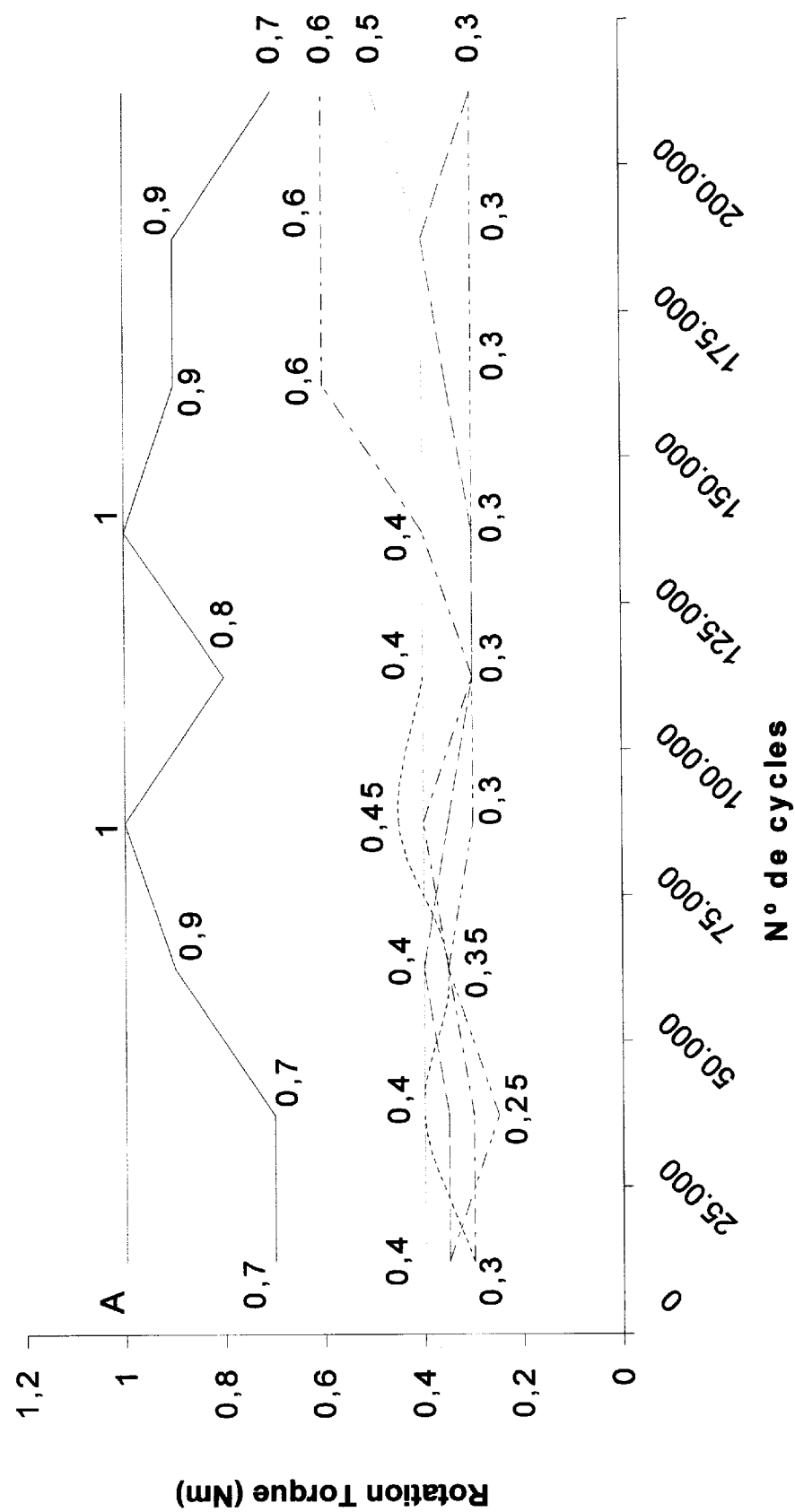
FIG. 2 is a chart similar to that shown in FIG. 1, with the difference that the valve was closed when the rotation torque was measured.

Every 25,000 cycles a halt was made for checking in order to measure the rotation torques with the valve open (chart of FIG. 1) and with the valve closed (chart of FIG. 2).

Said figures show the maximum value that rotation torque can have according to standard UNE EN 817/1997, shown by means of the horizontal line A. Said maximum value is 1 Nm.

The curve showing the highest values relates to ceramic discs without grease and without any type of coating. As the two charts show, very high values are obtained in the case of the rotation torque in open position, even exceeding the maximum value of 1 Nm.

The other curves show the results obtained with different ceramic discs coated with DLC, the coating having been applied according to the method of this invention.

As the results obtained in the charts show, the mechanical duration of the discs in the valve cartridge of the invention is excellent, with maximum values of 0.6 Nm obtained.

Despite the fact that reference has been made to one specific embodiment of the invention, it will be obvious to a person skilled on the art that the method and the ceramic disc described allow of many variations and modifications, and that all the details mentioned can be replaced by others that are technically equivalent, without departing from the sphere of protection defined in the attached claims.

What is claimed is:

1. Method for coating previously lapped and polished ceramic discs, characterized in that it includes the phases of:
   preparation of said ceramic discs; and
   deposition of a layer of hydrogenated amorphous carbon on said ceramic discs;
   with said deposition phase including the following stages:
   exposure of said ceramic discs to a vacuum;
   application of a cleaning plasma on said ceramic discs;
   application of a first deposition plasma on said ceramic discs; and
   application of a second deposition plasma on said ceramic discs.

2. Method according to claim 1, characterized in that said deposition is carried out by chemical vapour deposition assisted by radio frequency plasma.

3. Method according to claim 1, characterized in that said deposition stage is carried out at room temperature.

4. Method according to claim 1, characterized in that said cleaning plasma is applied by means of argon, at a pressure between 8 and 12 Pa, with an auto polarization power of between −1000 and −600 V and for a period of time of between 4 and 10 minutes.

5. Method according to claim 1, characterized in that said first deposition plasma is applied by means of methane, at a pressure between 8 and 12 Pa, with an auto polarization power of between −400 and −1000 V, with a radio frequency power between 250 and 275 W, and for a period of time of between 2 and 5 minutes.

6. Method according to claim 1, characterized in that said second deposition plasma is applied by means of methane, at a pressure between 8 and 12 Pa, with an auto polarization power of between −300 and −700 V, with a radio frequency power between 40 and 60 W, and for a period of time of between 5 and 9 minutes.

7. Method according to claim 1, characterized in that said phase of preparation of the ceramic discs includes the following phases:

cleaning of the ceramic discs;

drying of said ceramic discs; and evaporation of substances impregnated in said ceramic discs.

8. Method according to claim 7, characterized in that said cleaning of the ceramic discs is carried out by means of acetone and ethanol baths in an ultrasound washer for a period of time between 15 and 25 minutes.

* * * * *

UNITED STATES PATENT AND TRADEMARK OFFICE
CERTIFICATE OF CORRECTION

PATENT NO.    : 6,720,035 B2
DATED         : April 13, 2004
INVENTOR(S)   : Andujar et al.

It is certified that error appears in the above-identified patent and that said Letters Patent is hereby corrected as shown below:

<u>Title page,</u>
Item [75], Inventors, "Maria" should read -- Marta --

Signed and Sealed this

Twenty-eighth Day of December, 2004

JON W. DUDAS
*Director of the United States Patent and Trademark Office*